(12) United States Patent
Song et al.

(10) Patent No.: US 9,489,099 B2
(45) Date of Patent: Nov. 8, 2016

(54) FABRICATION METHOD OF PLATE PATTERN

(71) Applicant: LG ELECTRONICS INC., Seoul (KR)

(72) Inventors: Hooyoung Song, Seoul (KR); Minwoo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/698,405

(22) Filed: Apr. 28, 2015

(65) Prior Publication Data

US 2015/0309350 A1 Oct. 29, 2015

(30) Foreign Application Priority Data

Apr. 29, 2014 (KR) .................. 10-2014-0051426

(51) Int. Cl.
| | | |
|---|---|---|
| *H01B 13/00* | (2006.01) | |
| *G06F 3/044* | (2006.01) | |
| *H01L 51/00* | (2006.01) | |
| *H01L 51/52* | (2006.01) | |
| *H01L 51/44* | (2006.01) | |
| *H01L 21/033* | (2006.01) | |

(52) U.S. Cl.
CPC ......... *G06F 3/044* (2013.01); *H01L 51/0023* (2013.01); *H01L 21/0331* (2013.01); *H01L 51/442* (2013.01); *H01L 51/5209* (2013.01); *H01L 51/5212* (2013.01)

(58) Field of Classification Search
CPC ... G06F 3/044; H01L 21/00; H01L 51/5209; H01L 51/5212
USPC .......................................... 216/37, 67, 83, 13
See application file for complete search history.

(56) References Cited

U.S. PATENT DOCUMENTS

| 9,231,132 B2 * | 1/2016 | Masunaga ......... H01L 31/02243 |
| 2013/0244003 A1 * | 9/2013 | Yoo ........................ B82Y 30/00 428/143 |

FOREIGN PATENT DOCUMENTS

| KR | 10-2011-0078570 A | 7/2011 |
| KR | 10-2013-0099752 A | 9/2013 |

* cited by examiner

*Primary Examiner* — Duy Deo
*Assistant Examiner* — Maki Angadi
(74) *Attorney, Agent, or Firm* — Birch, Stewart, Kolasch and Birch, LLP

(57) ABSTRACT

Disclosed herein is a fabrication method of a plate pattern including preparing an object on which the plate pattern will be formed, disposing hybrid particles having a hybrid structure of organic and inorganic substances on one surface of the object into a single layer, etching at least the hybrid particles, forming the plate pattern on the surface of the object on which the hybrid particles are disposed, and removing the hybrid particles.

19 Claims, 14 Drawing Sheets (a)

(b)

(a)

(b)

(a)

(b)

FABRICATION METHOD OF PLATE PATTERN

CROSS-REFERENCE TO RELATED APPLICATION

This application claims the benefit of Korean Patent Application No. 10-2014-0051426, filed on Apr. 29, 2014 in the Korean Intellectual Property Office, the disclosure of which is incorporated herein by reference.

BACKGROUND OF THE INVENTION

1. Field of the Invention

The present invention relates to a fabrication method of a plate pattern.

2. Description of the Related Art

Recently, flat panel displays having excellent characteristics, such as thin thickness, light weight and low power consumption, have been developed and applied to various fields.

A liquid crystal display (LCD) has high display quality and characteristics, such as thin thickness, light weight and low power consumption, and is thus widely used in various devices from a small portable terminal to a large TV.

An organic light emitting diode (OLED) display is an element in which electrons and holes are injected into a light emitting layer formed between a cathode, i.e., an electron injection electrode, and an anode, i.e., a hole injection electrode, and are recombined to emit light. Such an OLED may be formed on a flexible substrate formed of plastic, have an excellent sense of color due to self-light emitting and be driven at a low voltage (10V or less) and thus have comparatively low power consumption.

The above-descried LCD generally includes a touch panel to easily receive a user command.

The touch panel uses a transparent electrode formed of a conductor which transmits light of the LCD. The transparent electrode requires high transmittance, a thin thickness and a narrow width but it is difficult to form a transparent electrode pattern.

Particularly, when a large-area transparent electrode is formed of indium tin oxide (ITO) which is one material for a transparent electrode, there are disadvantages, such as a high cost, scarcity of indium, which is a rare-earth element, and a difficulty in manufacture of a flexible substrate.

A metal grid is known as a strong substitute for ITO to implement a flexible and large-area touch panel. However, a conventional printing and photolithography method has disadvantages, such as lowering of transmittance and Moiré interference due to a broad line width.

A light emitting diode (LED) is an element which converts an electrical signal into an optical signal using characteristics of a compound semiconductor and is widely used in electric home appliances, remote controllers, electric bulletin boards, displays, various automated machines and the like, and application fields thereof are increasing.

A transparent electrode pattern which assists current dispersion and transmits light is formed on one surface of the LED. Research to fabricate a transparent electrode pattern having a thin thickness and a narrow width is underway.

Further, formation of a pattern on a phosphor plate used in a light emitting device is not easy through a general method and, if spherical particles are used, disposition of the spherical particles is not easy.

SUMMARY OF THE INVENTION

An object of the present invention is to provide a fabrication method of a transparent electrode or a phosphor plate having a thin line width and a small thickness and a light emitting element or a touch panel having the fabricated transparent electrode.

The objects of the present invention are not limited to the above-mentioned objects and other objects that have not been mentioned above will become evident to those skilled in the art from the following description.

To achieve the above objects, there is provided a fabrication method of a plate pattern according to an exemplary embodiment of the present invention, including preparing an object on which the plate pattern will be formed, disposing hybrid particles having a hybrid structure of organic and inorganic substances on one surface of the object into a single layer, etching at least the hybrid particles, forming the plate pattern on the surface of the object on which the hybrid particles are disposed, and removing the hybrid particles.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

The advantages and features of the present invention, and the way of attaining them, will become apparent with reference to embodiments described below in conjunction with the accompanying drawings. Reference will now be made in detail to the preferred embodiments of the present invention, examples of which are illustrated in the accompanying drawings. Wherever possible, the same reference numbers will be used throughout the drawings to refer to the same or like parts.

Figure 1:
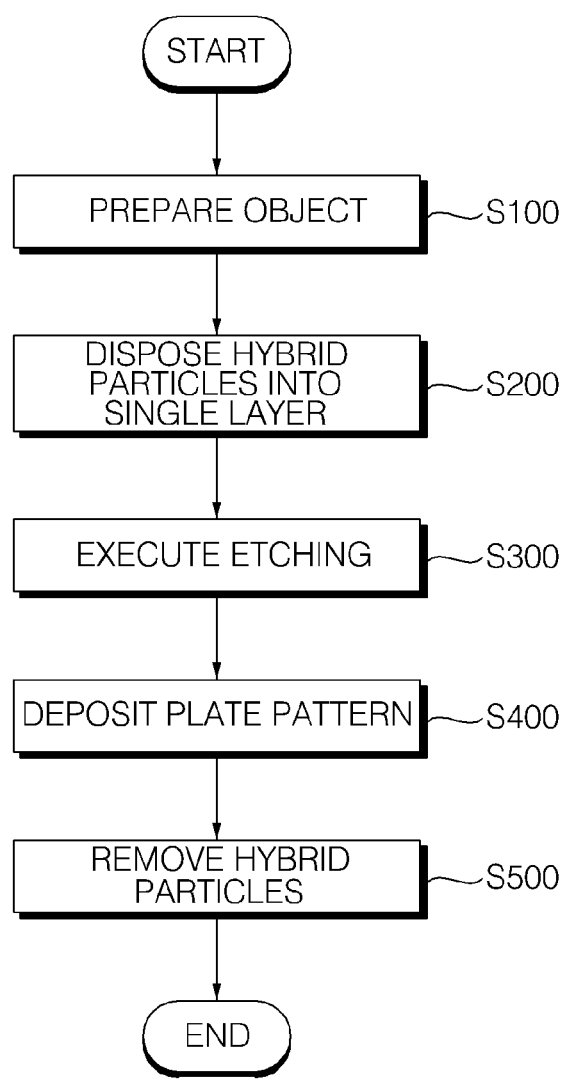
FIG. 1 is a flowchart illustrating a fabrication method of a plate pattern in accordance with one embodiment of the present invention.
Figure 2:
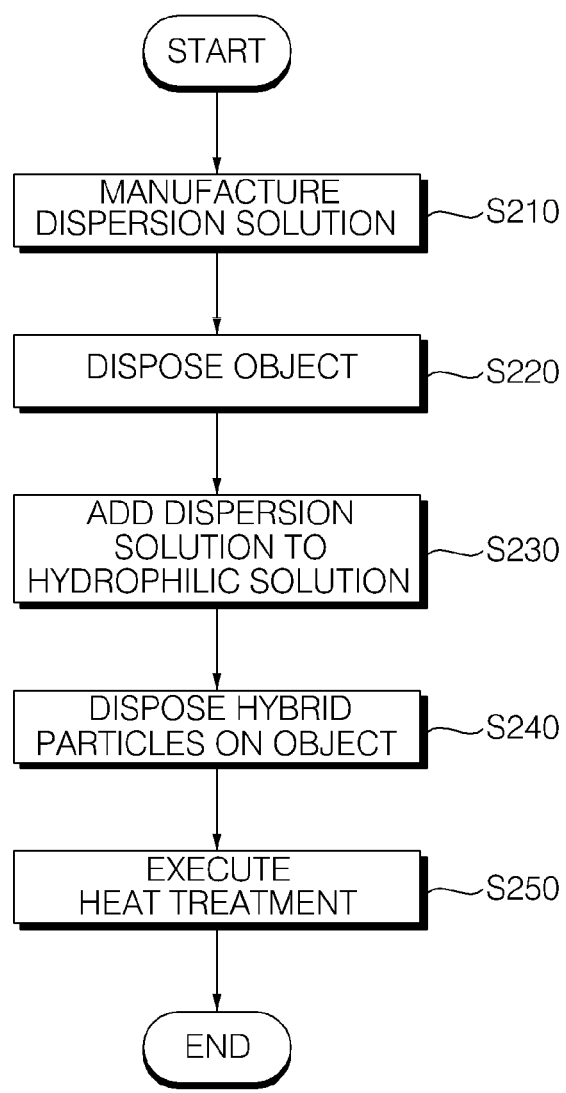
FIG. 2 is a flowchart illustrating disposition of hybrid particles into a single layer in accordance with the embodiment of the present invention.

FIG. 1 is a flowchart illustrating a fabrication method of a plate pattern in accordance with one embodiment of the present invention, FIG. 2 is a flowchart illustrating disposition of hybrid particles into a single layer in accordance with the embodiment of the present invention, and FIGS. 3 to 10(b) are views sequentially illustrating the fabrication method in accordance with the embodiment of the present invention.

With reference to FIG. 1, a fabrication method of a plate pattern 190 in accordance with one embodiment of the present invention includes preparing an object on which the plate pattern 190 will be formed (Operation S110), disposing hybrid particles 10 having a hybrid structure of organic and inorganic substances on one surface of the object into a single layer (Operation S200), etching at least the hybrid particles 10 (Operation S300), forming a plate pattern 190 by depositing a transparent electrode in spaces between the hybrid particles 10 formed by etching (Operation S400), and removing the hybrid particles 10 (Operation S500).

With reference to FIG. 2, disposition of the hybrid particles 10 into the single layer (Operation S200) may include manufacturing a dispersion solution by dispersing the hybrid particles 10 having a hybrid structure of organic and inorganic substances in a nonpolar solvent 20 (Operation S210), disposing the object 100 within a hydrophilic solution (Operation S220), adding the dispersion solution to the hydrophilic solution 30 (Operation S230), and disposing the hybrid particles 10 on the object 100 (Operation S240).

First, in preparation of the object 100 (Operation S100), the object 100 on which the plate pattern 190 will be formed is prepared.

Here, the object 100 means an article on which the plate pattern 190 will be formed, i.e., an electronic part using the plate pattern 190. For example, the object 100 may include one of a light emitting element, a touch panel and a touchscreen. A light emitting element and a touch panel including the plate pattern 190 will be described later.

In preparation of the object 100 (Operation S100), a surface of the object 100 on which the plate pattern 190 will be formed may be set and planarizing and cleaning of the surface of the object 100 on which the plate pattern 190 will be formed may be carried out.

With reference to FIGS. 3 to 7B, in disposition of the hybrid particles 10 into the single layer (Operation S200), the hybrid particles 10 are disposed on one surface of the object 100 into a single layer.

Here, the disposition of the hybrid particles 10 into the single layer means disposition of the hybrid particles 10 on the object 100 into one layer in the vertical direction.

Figure 7A:
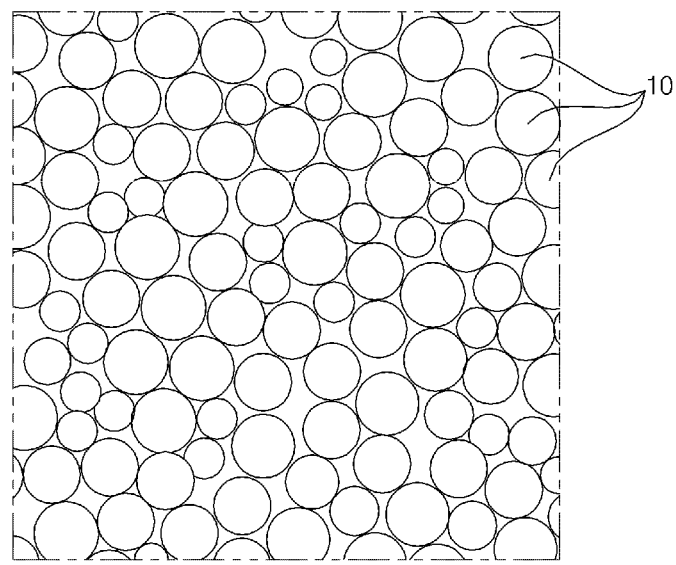
Figure 7B:
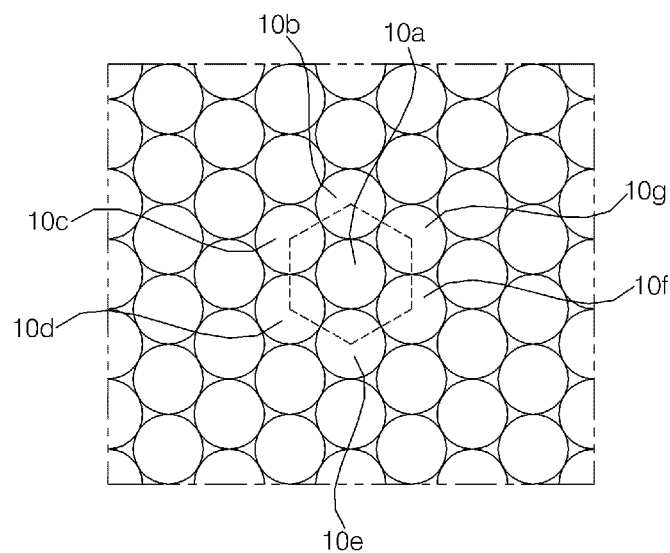
Figure 8:
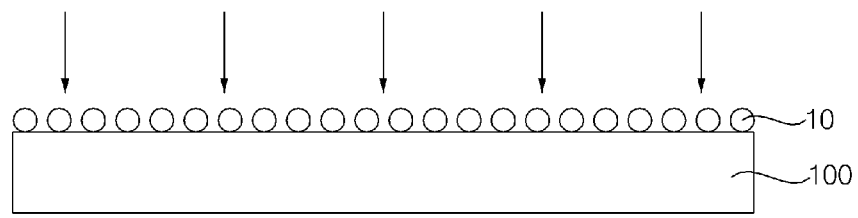
Figure 8:
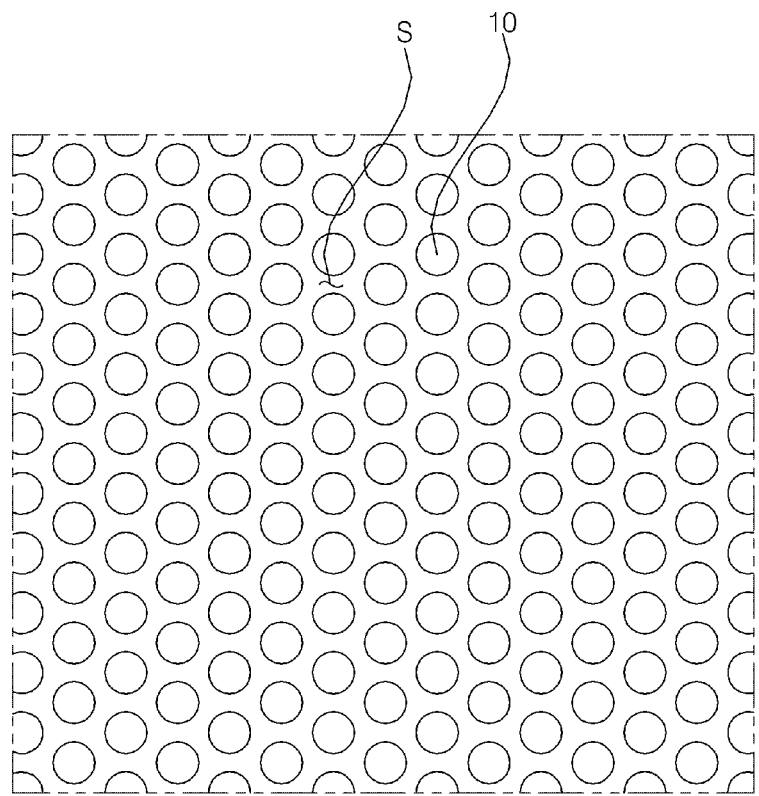
Figure 9:
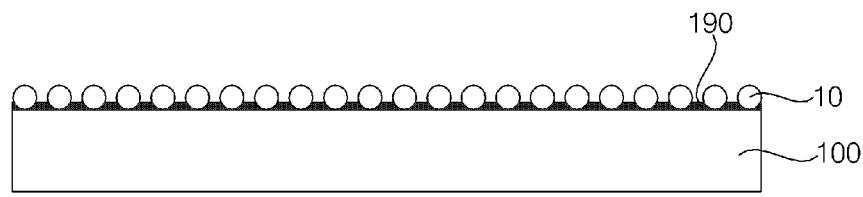
Figure 9:
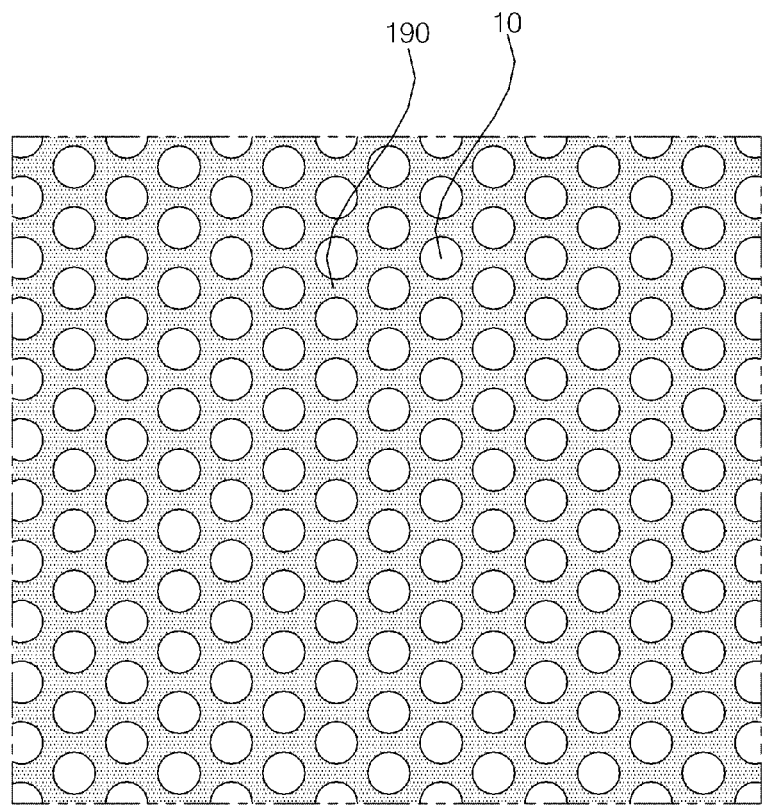
Figure 10:
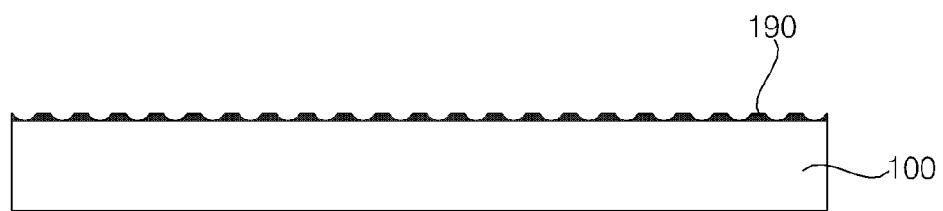
Figure 10:
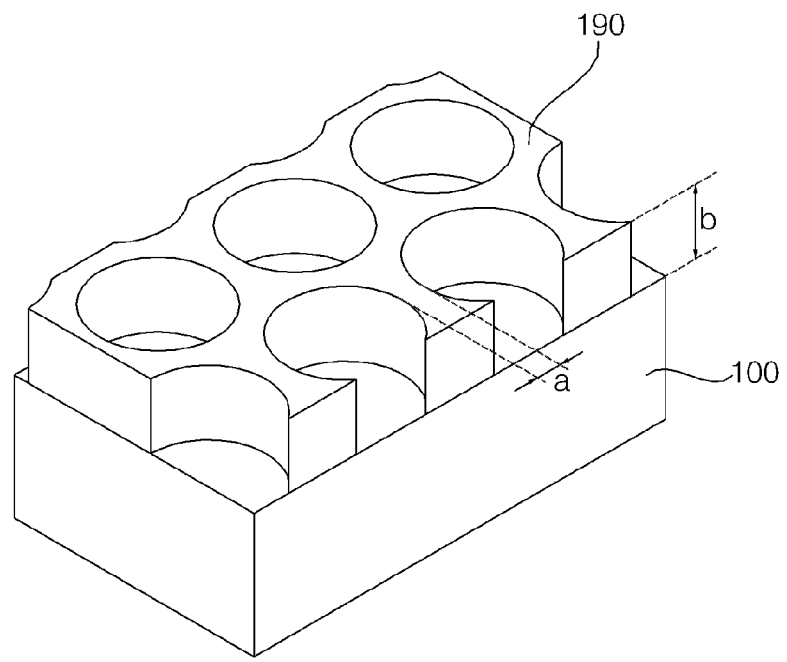

With reference to FIGS. 7A and 7B, the hybrid particles 10 may be disposed on one surface of the object 100 in a matrix.

In more detail, as seen from a plane, the hybrid particles 10 may have a hexagonal close packed structure, i.e., a structure in which one hybrid particle 10a is surrounded by six neighboring hybrid particles 10b to 10g. The hexagonal close packed structure of the hybrid particles 10 means a structure in which the hybrid particles 10 are disposed while maximally reducing air gaps among the hybrid particles 10 on the plane.

The sizes of the hybrid particles 10 may be equal or be different, preferably equal. If the hybrid particles 10 are etched during a subsequent process, in order to form the same space among the hybrid particles 10, the sizes of the hybrid particles 10 need to be equal. Such sizes of the hybrid particles 10 influence uniform disposition of the plate pattern 190.

Further, one hybrid particle 10a may contact six neighboring hybrid particles 10b to 10g. If one hybrid particle 10a is separated from six neighboring hybrid particles 10b to 10g, when an etching process is carried out, the sizes of spaces among the hybrid particles 10 become different and thus a uniform plate pattern 190 may not be formed.

When the hybrid particles are densely disposed such that one hybrid particle 10a contacts six neighboring hybrid particles 10b to 10g, a uniform plate pattern 190 may be formed after the etching process.

The hybrid particles 10 may have a spherical shape. If the hybrid particles 10 have a spherical shape, etching is carried out starting from air gaps among the hybrid particles and thus spaces among the hybrid particles 10 may be generated.

Particularly, in order to fabricate the plate pattern 190 having a uniform and narrow width, disposition of the hybrid particles 10 serving as a mask is important. When the hybrid particles 10 are disposed so as to have the above-described structure, the plate pattern 190 having a uniform and narrow line width may be fabricated through the subsequent process.

However, since the plate pattern 190 has a narrow width, the size of the hybrid particles 10 is reduced. When the hybrid particles 10 have a very small size (for example, 10 nm to 10 µm), disposition of the hybrid particles 10 into a single layer is difficult and the above-described dense disposition of the hybrid particles 10 is difficult.

Therefore, hereinafter, composition of the hybrid particles 10 and a disposition method of the hybrid particles 10 so as to dispose the hybrid particles into a single layer having a dense structure will be described.

Disposition of the hybrid particles 10 into the single layer (Operation S200) may include manufacturing a dispersion solution by dispersing the hybrid particles 10 having a hybrid structure of organic and inorganic substances in a nonpolar solvent 20 (Operation S210), disposing the object 100 within a hydrophilic solution 30 (Operation S220), adding the dispersion solution to the hydrophilic solution 30 (Operation S230), and disposing the hybrid particles 10 on the object 100 (Operation S240).

Figure 3:
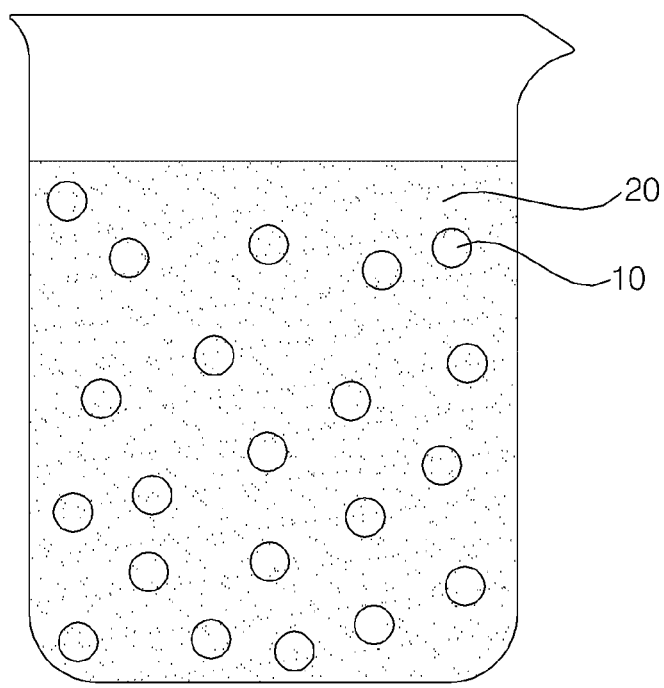
FIGS. 3 to 10 are views sequentially illustrating the fabrication method in accordance with the embodiment of the present invention.

With reference to FIG. 3, in manufacture of the dispersion solution (Operation S210), the hybrid particles 10 having a hybrid structure of organic and inorganic substances may be dispersed in the nonpolar solvent 20.

The hybrid particles 10 may include silicon (Si). The hybrid particles 10 may have a hybrid structure of organic and inorganic substances based on silicon. The hybrid particles 10 may have a structure in which an organic substance is mixed with a derivative of an inorganic substance containing silicon.

The hybrid particles 10 may have a size of 10 nm to 1 µm. If the size of the hybrid particles is less than 10 nm, most of the hybrid particles 10 are removed through etching during the subsequent process and thus, the plate pattern 190 may not be formed. If the size of the hybrid particles 10 is greater than 1 µm, air gaps among the hybrid particles 10 are enlarged and thus, the thickness of the plate pattern 190 may be excessively increased.

The hybrid particles 10 may be formed of, for example, polydimethylsiloxane or polymethylsilsesquioxane. The hybrid particles 10 may have a spherical shape. If the object 100 is etched using the hybrid particles 10 having a hybrid structure including organic and inorganic substances as a mask, dry etching is possible.

In manufacture of the dispersion solution by dispersing the hybrid particles 10 having a hybrid structure of organic and inorganic substances in the nonpolar solvent 20 (Operation S210), the hybrid particles 10 and the nonpolar solvent 20 may be mixed. The hybrid particles 10 may be dispersed in the nonpolar solvent 20.

The nonpolar solvent 20 may be a substance having a lower density than water. The nonpolar solvent 20 may be a volatile solution.

The nonpolar solvent 20 means a solution composed of nonpolar molecules or molecules of one kind of material which is very close thereto and nonpolarity means a phenomenon in which electron distribution is not biased to one atom of a chemical bond in a molecule and is uniform. For example, the nonpolar solvent 20 may be ethanol, methanol, isopropyl alcohol or butanol, but is not limited thereto.

Figure 4:
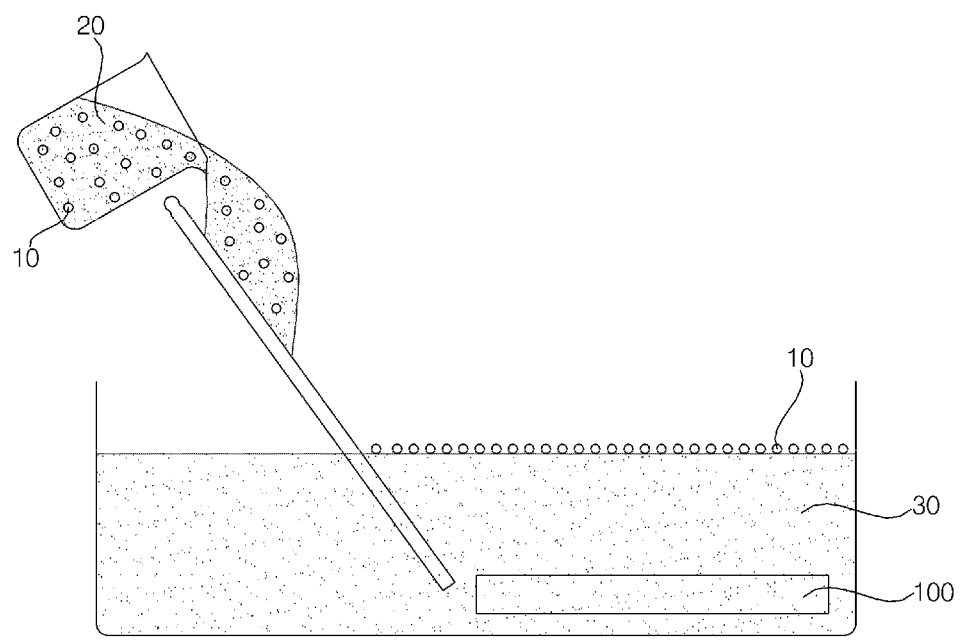

With reference to FIG. 4, in disposition of the object 100 within the hydrophilic solution 30 (Operation S220), the object 100 may be submerged in the hydrophilic solution 30. Here, one surface of the object 100 on which the plate pattern 190 will be formed is located in the opposite direction to gravity.

The hydrophilic solution 30 means a solution which strongly interacts with water and dissolves in water with a strong affinity with water. Generally, the hydrophilic solution 30 may be a polar solution. For example, the hydrophilic solution 30 may be water. The object 100 may be disposed within the hydrophilic solution 30.

In addition of the dispersion solution to the hydrophilic solution 30 (Operation S230), the dispersion solution including the hybrid particles 10 may be added to the hydrophilic solution 30. The dispersion solution may float on the hydrophilic solution 30. The hybrid particles 10 may be hydrophobic. The hybrid particles 10 having hydrophobicity may float on the hydrophilic solution 30.

In addition of the dispersion solution to the hydrophilic solution 30 (Operation S230), a single layer of the dispersion solution may float on the hydrophilic solution 30. Further, in addition of the dispersion solution to the hydrophilic solution 30 (Operation S230), a monolayer of the dispersion solution may float on the hydrophilic solution 30.

Figure 5:
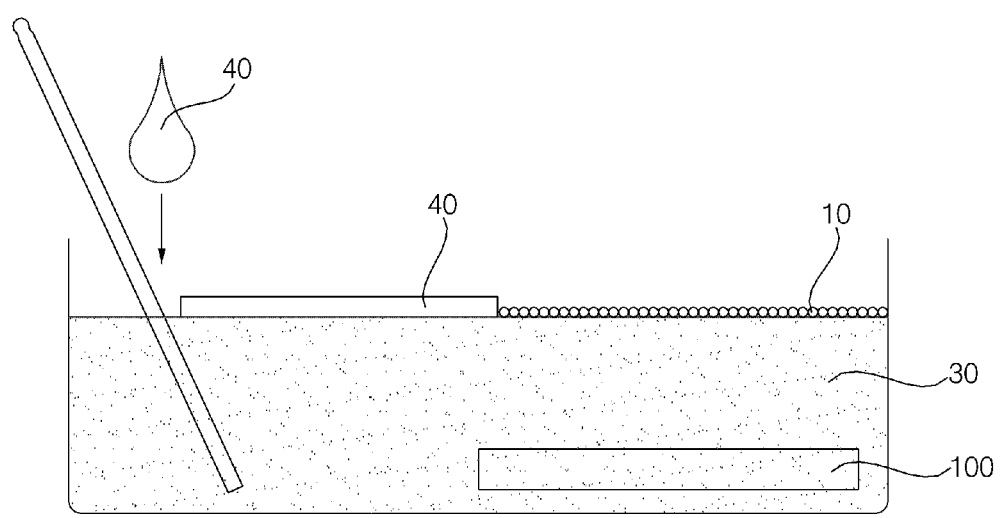

With reference to FIG. 5, in disposition of the hybrid particles 10 on the object 100 (Operation S240), the nonpolar solvent 20 of the dispersion solution may be volatilized. As the nonpolar solvent 20 of the dispersion solution is volatilized, a monolayer of the hybrid particles 10 having a hexagonal close packed (HCP) structure may float on the hydrophilic solution 30.

In disposition of the hybrid particles 10 on the object 100 (Operation S240), an amphiphilic solution 40 may be added to the hydrophilic solution 30. If the amphiphilic solution 40 is added to the hydrophilic solution 30, the amphiphilic solution 40 may densely concentrate the hybrid particles 10 at a position vertically overlapping the object 10.

Here, the amphiphilic solution 40 is a solution having both hydrophilicity and hydrophobicity. For example, the amphiphilic solution 40 may include a surface active agent.

The amphiphilic solution 40 may easily form the above-described dense hexagonal close packed structure of the hybrid particles 10.

Figure 6:
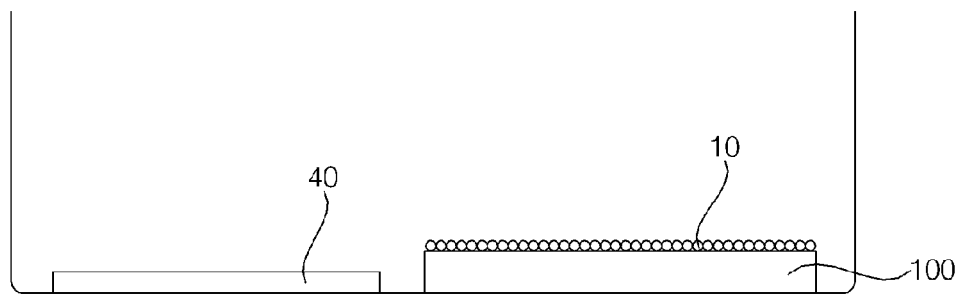

With reference to FIG. 6, in disposition of the hybrid particles 10 on the object 100 (Operation S240), the hydrophilic solution 30 may be removed.

In disposition of the hybrid particles 10 on the object 100 (Operation S240), the hydrophilic solution 30 may be removed under the condition that the hybrid particles 10 are concentrated at the position vertically overlapping the object 200.

In disposition of the hybrid particles 10 on the object 100 (Operation S240), as the hydrophilic solution 30 is removed, the hybrid particles 10 gradually become closer to the object 100 and then are uniformly disposed on the upper surface of the object 100 by gravity.

The fabrication method of the plate pattern 190 in accordance with the embodiment may further include executing heat treatment of the object 100 provided with the upper surface on which the hybrid particles 10 are disposed (Operation S250). By heat treatment of the object 100 provided with the upper surface on which the hybrid particles 10 are disposed, the hybrid particles 10 may be fixed to the object 100.

FIG. 8(a) is a cross-sectional view illustrating the etching process and FIG. 8(b) is a plan view illustrating the etching process.

With reference to FIGS. 8(a) and 8(b), at least the hybrid particles 10 are etched (Operation S300).

In etching (Operation S300), at least the hybrid particles 10 may be etched. In detail, the hybrid particles 10 and the object 100 provided with the hybrid particles 10 disposed on the upper surface thereof may be etched together.

In more detail, in etching (Operation S300), the hybrid particles 10 may be etched so that the volumes of the hybrid particles 10 may be reduced and the hybrid particles 10 may not contact one another. That is, as the volumes of the hybrid particles 10 on the plane are reduced, spaces S among the hybrid particles 10 are formed.

Further, the spaces S among the hybrid particles 10 are spaces in which the plate pattern 190 is located during the subsequent process. Particularly, the spaces S among the hybrid particles 10 communicate with one another and thus the electrically connected plate pattern 190 is formed.

In consideration of a time for which the spaces S among the hybrid particles 10 communicate with one another, an etching time is adjusted.

Various methods for corroding the hybrid particles 10 may be used as an etching method. For example, wet etching or dry etching may be used.

Here, wet etching refers to etching of the hybrid particles 10 using an acid solution and the like.

Dry etching may be used as the etching method. For example, plasma dry etching may be carried out on the object 100 provided with the hybrid particles 10 provided on the upper surface thereof. For example, dry etching may be one of sputtering, reactive radical etching and ion etching.

When the hybrid particles 10 are etched, the upper surface of the object 100 on which the hybrid particles 10 are located may be etched. However, the disclosure is not limited thereto.

Particularly, in the embodiment, the size of the spaces S among the hybrid particles 10 may be minutely adjusted by adjusting the sizes of the hybrid particles 10 and the etching time of the hybrid particles 10. Therefore, the size and thickness of the plate pattern 190 located in the spaces S among the hybrid particles 10 may be finely adjusted. Further, in the embodiment, the plate pattern 190 having a uniform and narrow width may be fabricated.

With reference to FIGS. 9(a) and 9(b), in formation of the plate pattern 190 (Operation S400), the plate pattern 190 is formed on the surface of the object 100 on which the hybrid particles 10 are disposed.

In detail, in formation of the plate pattern 190 (Operation S400), a plate pattern layer may be deposited on the surface of the object 100 exposed through the spaces S among the hybrid particles 10.

Since the etched hybrid particles 10 serve as a mask, the surface of the object 100 is exposed through the spaces S among the hybrid particles 10. When a transparent electrode is deposited on the upper surface of the object 100, the plate pattern layer is deposited on the upper surfaces of the hybrid particles 10 and the surface of the object 100 exposed through the spaces S among the hybrid particles 10.

The plate pattern 190 may include all materials which may be deposited on the object 100 as a layer. For example, the plate pattern 190 may include one of a transparent electrode, an electrode, a metal, and a non-metal organic semiconductor layer or inorganic semiconductor layer.

Hereinafter, the plate pattern 190, which is a transparent electrode pattern, will be exemplarily described.

The transparent electrode may be formed using, for example, metal organic chemical deposition (MOCVD), chemical vapor deposition (CVD), plasma-enhanced chemical vapor deposition (PECVD), molecular beam epitaxy (MBE), hydride vapor phase epitaxy (HYPE), sputtering and the like, but the disclosure is not limited thereto.

The transparent electrode may include one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, a metal grid, a silver nanowire and graphene.

A metal grid, which has excellent economic efficiency and flexible performance but is difficult to form a transparent electrode having a narrow width using a general method, may be used as a material of the transparent electrode in the embodiment.

When a transparent electrode pattern is formed using a metal grid through the fabrication method in accordance with the embodiment, the fabricated transparent electrode pattern may have excellent economic efficiency, flexible performance and transmittance.

The width a of the plate pattern 190 may be 10 nm to 600 nm. When the plate pattern 190 having a thin thickness is fabricated using the fabrication method in the embodiment, disadvantages, such as lowering of transmittance and Moiré interference due to a broad line width, may be overcome.

The thickness b of the plate pattern 190 is not limited. The thickness b of the plate pattern 190 may be adjusted by the deposition time of the plate pattern 190.

Further, the plate pattern 190 may be formed into a single or formed into multiple layers by depositing different kinds of materials.

For example, if the plate pattern 190 is a transparent electrode pattern, a first layer may be formed of ITO and a second layer including a metal grid may be formed on the first layer. However, the plate pattern 190 is not limited thereto and may be formed into a multilayered structure using different kinds of materials selected from various materials which may form the plate pattern 190.

The plate pattern 190 may be electrically connected to the object 100. Therefore, the plate pattern 190 may supply electricity to the object 100 or transmit sensing information to the object 100.

With reference to FIGS. 10(a) and 10(b), in removal of the hybrid particles 10 (Operation S500), the hybrid particles 10 remaining after deposition of the transparent electrode are removed from the surface of the object 100.

Various methods may be used to remove the hybrid particles 10 from the surface of the object 100. For example, since the hybrid particles 10 and the surface of the object 100 are very weakly bonded and the plate pattern 190 and the object 100 are very strongly bonded, the hybrid particles 10 may be removed from the surface of the object 100 by applying pressure to the surface of the object 100 using air or a solution. Further, a solvent to release bonding between the hybrid particles 10 and the surface of the object 100 may be used.

Further, after removal of the hybrid particles 10, a cleaning process may be carried out.

When the hybrid particles 10 are removed, the plate pattern 190 of a mesh type is formed, as exemplarily shown in FIG. 10(b). Such a plate pattern 190 may transmit most of light emitted from the object 100 and be electrically connected to the object 100 so as to transmit an electrical signal to the object 100.

The plate pattern 190 may be formed on the plane in a shape including a plurality of air gaps separated from one another by a designated distance.

FIGS. 11(a) to 11(e) are views sequentially illustrating a fabrication method of a plate pattern in accordance with another embodiment of the present invention.

With reference to FIGS. 11(a) to 11(e), a fabrication method of a plate pattern in accordance with this embodiment differs from the fabrication method in accordance with the former embodiment in that a sacrificial layer 13 is further formed between hybrid particles 10 and one surface of an object 100 on which the hybrid particles 10 are disposed.

The sacrificial layer 13 means a layer which is partially etched by a subsequent process, serves as a mask and is then removed.

The sacrificial layer 13 may be formed by CVD, PVD, ALD or another suitable method and be formed of the same material as the object 100. Further, the sacrificial layer 13 may include TiN.

The sacrificial layer 13 has a thickness of about 5 nm to about 15 nm.

Figure 11:
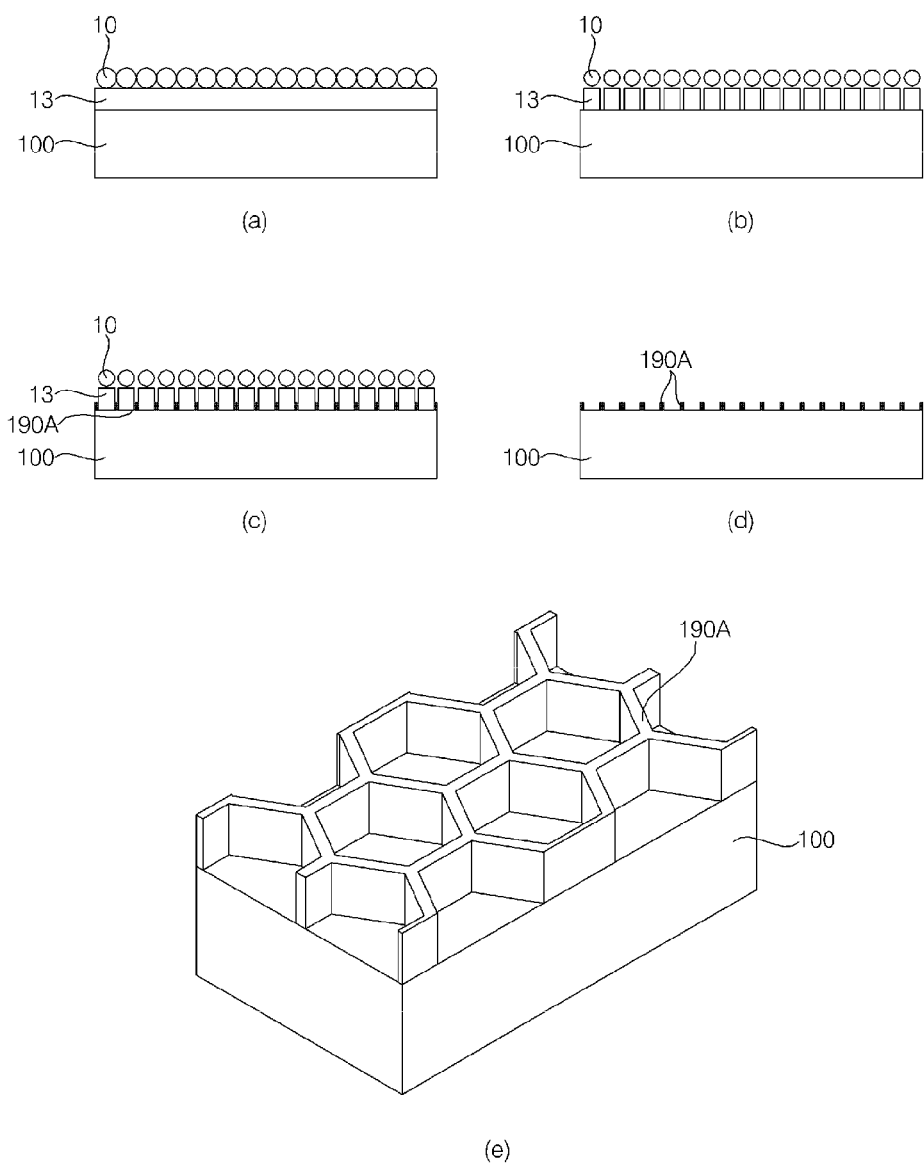
FIG. 11 illustrates views sequentially illustrating a fabrication method of a plate pattern in accordance with another embodiment of the present invention.

With reference to FIG. 11(a), in the embodiment, the hybrid particles 10 are disposed on the sacrificial layer 13 into a single layer (Operation S200).

With reference to FIG. 11(b), one surface of the object 100 and the hybrid particles 10 are etched (Operation S300). Here, at least the sacrificial layer 13 is etched so that the surface of the object 100 may be exposed through the sacrificial layer 13.

Of course, the same effect as the sacrificial layer 13 may be attained using a part of the upper surface of the object 100 without the sacrificial layer 13.

With reference to FIG. 11(c), a transparent electrode is deposited on the upper surface of the sacrificial layer 13 and the upper surface of the object 100 exposed through the sacrificial layer 13.

With reference to FIGS. 11(d) and 11(e), when the sacrificial layer 13 and the hybrid particles 10 are removed, a plate pattern 190 is formed. Such a plate pattern 190 has a narrower line width.

In this embodiment, a uniform plate pattern may be fabricated by uniformly disposing hybrid particles into a single layer due to characteristics of the hybrid particles.

Further, by adjusting the etching time of the hybrid particles and the sizes of the hybrid particles, plate patterns having various thicknesses and line widths may be easily fabricated and, particularly, a plate pattern having a thin line width may be easily fabricated.

Further, in this embodiment, the plate pattern is formed using a metal grid and may thus have excellent economic efficiency, flexible performance and transmittance.

Moreover, in this embodiment, the plate pattern having a thin thickness may be formed and, thus, disadvantages, such as lowering of transmittance and Moiré interference due to a broad line width, may be overcome.

Figure 12:
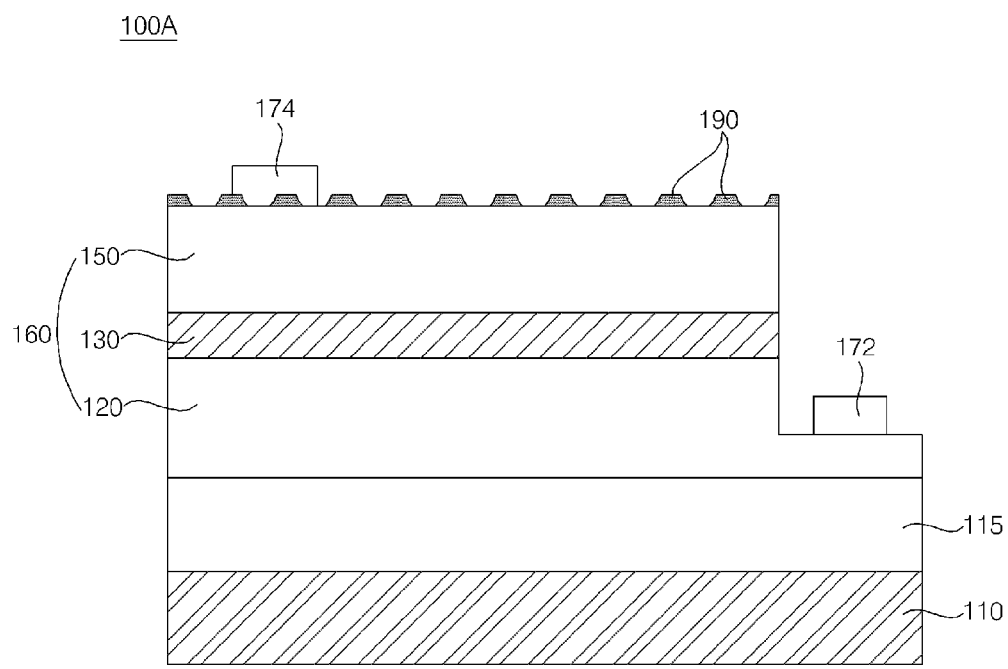
FIG. 12 is a view illustrating a light emitting element fabricated by a fabrication method of a plate pattern in accordance with the present invention.

FIG. 12 is a view illustrating a light emitting element fabricated by a fabrication method of a plate pattern in accordance with the present invention.

FIG. 12 illustrates a light emitting element as an object 100A in accordance with one embodiment.

The light emitting element 100A of the embodiment may include a light emitting structure 160 generating light and a plate pattern 190 electrically connected to the light emitting structure 160.

Further, the plate pattern 190 may be electrically connected to an electrode.

In more detail, the light emitting structure 160 may include a first semiconductor layer 120, a second semiconductor layer 150 and an active layer 130 formed between the first semiconductor layer 120 and the second semiconductor layer 150.

The plate pattern 190 may be disposed on the upper surface of the semiconductor layer 150. The plate pattern 190 may be electrically connected to a second electrode 174 electrically connected to the second semiconductor layer 150.

Such a plate pattern 190 may disperse current supplied to the semiconductor layer 150 to the entirety of the second semiconductor layer 150, thus increasing luminous efficacy of the light emitting element 100A.

The light emitting structure 160 may be located on a substrate 110.

The substrate 110 may be foamed of a light transmissive material, for example, at least one of sapphire ($Al_2O_3$), GaN, ZnO and AlO, but is not limited thereto.

A buffer layer 115 to alleviate lattice mismatch between the substrate 110 and the first semiconductor layer 120 and facilitate growth of the first semiconductor layer 120 thereon may be located on the substrate 110. The buffer layer 115 may be formed in a low-temperature atmosphere and be formed of a material which may alleviate a difference of lattice constants between the substrate 110 and the first semiconductor layer 120. For example, the buffer layer 115 may be formed of one selected from the group consisting of GaN, InN, AlN, AlInN, InGaN, AlGaN and InAlGaN, but is not limited thereto.

The first semiconductor layer 120 may be located on the buffer layer 115 or the substrate 110. The first semiconductor layer 120 may be implemented as an n-type semiconductor layer and provide electrons to the active layer 130. The first semiconductor layer 120 may be formed of a semiconductor material having a formula of $In_xAl_yGa_{1-x-y}N$ ($0 \leq x \leq 1$, $0 \leq y \leq 1$, $0 \leq x+y \leq 1$), for example, one selected from the group consisting of GaN, AlN, AlGaN, InGaN, InN, InAlGaN and AlInN, and doped with an n-type dopant, such as Si, Ge or Sn.

The active layer 130 may be formed on the first semiconductor layer 120. The active layer 130 may be formed to have a single or multiple quantum well structure, a quantum-wire structure or a quantum dot structure using a group III-V compound semiconductor material.

The active layer 130 may have, for example, a single or multiple quantum well structure having well layers having a formula of $In_xAl_yGa_{1-x-y}N$ ($0 \leq x \leq 1$, $0 \leq y \leq 1$, $0 \leq x+y \leq 1$) and barrier layers having a formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the band gap of the barrier layer.

The second semiconductor layer 150 is located on the active layer 130. The second semiconductor layer 150 may be implemented as a p-type semiconductor layer so as to inject holes into the active layer 130. The second semiconductor layer 150 may be formed of a semiconductor material having a formula of $In_xAl_yGa_{1-x-y}N$ ($0 \leq x \leq 1$, $0 \leq y \leq 1$, $0 \leq x+y \leq 1$), for example, one selected from the group consisting of GaN, AlN, AlGaN, InGaN, InN, InAlGaN and AlInN, and doped with a p-type dopant, such as Mg, Zn, Ca, Sr and Ba.

Figure 13:
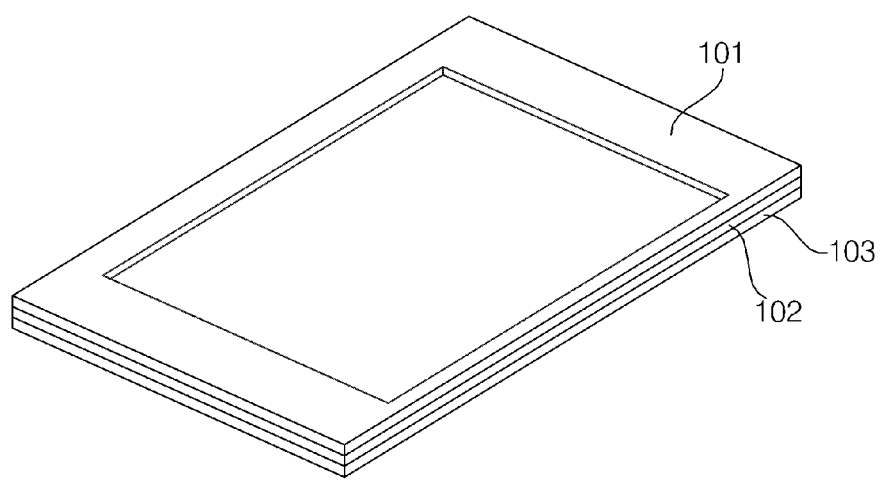
FIGS. 13 and 14 are views illustrating a touch panel fabricated by a fabrication method of a plate pattern in accordance with the present invention.
Figure 14:
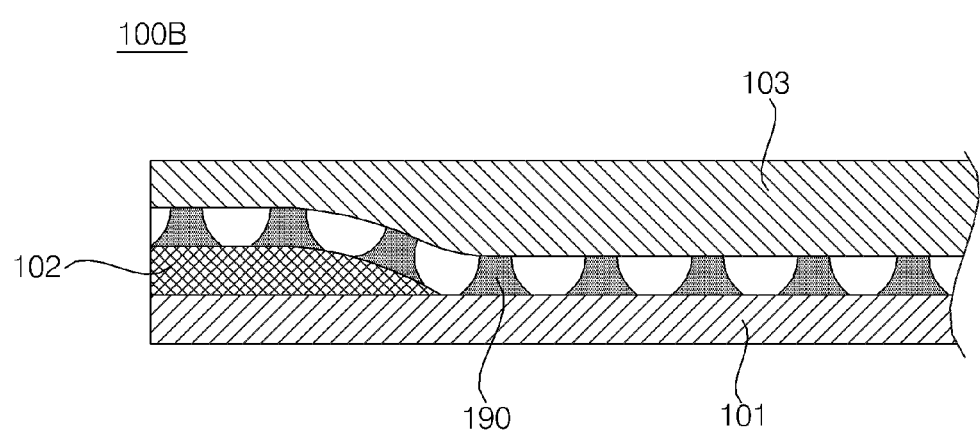

FIGS. 13 and 14 are views illustrating a touch panel fabricated by a fabrication method of a plate pattern in accordance with the present invention.

A touch panel 100B of this embodiment is a kind of object 100 on which a plate pattern 190 is formed.

With reference to FIGS. 13 and 14, the touch panel 100B of this embodiment may include a window member 101 and a sensor layer formed by disposing the plate pattern 190 integrated with the window member 101. The touch panel 100B of this embodiment is generally applied to a capacitive touchscreen. Here, the plate pattern 190 is a transparent electrode pattern.

The touch panel 100B in which the sensor layer is integrated with the window member 101 includes a bezel layer 102 formed by applying a pigment, such as an ink, along the edge of the inner surface of the window member 101. The bezel layer 102 shields structures provided on the inner surface of a device to which the window member 101 is attached and prevents light generated from a lighting unit of a display device from leaking to other areas except for an area transmitting light.

The sensor layer is formed by disposing the plate pattern 190 in a lattice shape or a trapezoidal shape and detects user input. That is, when the tip of a user's finger contacts the outer surface of the window member 101, the sensor layer senses change of capacitance or change of resistance and transmits such change to a controller. Here, the plate pattern 190 may extend to the bezel layer 102 and be connected to a circuit board on which the controller is provided through a flexible printed circuit board and the like.

Such a plate pattern 190 may be fabricated by the fabrication method in accordance with the above-described embodiment.

An insulating layer 103 may be further formed on the inner surface of the window member 101 so as to protect the plate pattern 190.

Of course, a display unit to output an image may be located on the insulating layer.

When the plate pattern 190 of the sensor layer is formed by the fabrication method of the present invention, the plate pattern 190 may have a thin thickness and a narrow line width and thus, user input may be sensitively received and an image output from the display unit may be clear.

As apparent from the above description, in a fabrication method of a plate pattern in accordance with one embodiment of the present invention, a uniform plate pattern may be fabricated by uniformly disposing hybrid particles into a single layer due to characteristics of the hybrid particles.

Further, by adjusting the etching time of the hybrid particles and the sizes of the hybrid particles, plate patterns having various thicknesses and line widths may be easily fabricated and, particularly, a plate pattern having a thin line width may be easily fabricated.

Further, in the embodiment, the plate pattern may be formed using a metal grid and thus have excellent economic efficiency, flexible performance and transmittance.

Moreover, in this embodiment, the plate pattern having a thin thickness may be fabricated and, thus, disadvantages, such as lowering of transmittance and Moiré interference due to a broad line width, may be overcome.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A fabrication method of a plate pattern, the method comprising:

preparing an object on which the plate pattern will be formed;

disposing hybrid particles having a hybrid structure of organic and inorganic substances on a surface of the object into a single layer;

etching at least the hybrid particles to reduce volumes of the hybrid particles;

forming the plate pattern on the surface of the object on which the hybrid particles are disposed; and removing the hybrid particles from the surface of the object, and wherein the disposing hybrid particles into the single layer includes:

manufacturing a dispersion solution by dispersing the hybrid particles having the hybrid structure of organic and inorganic substances in a nonpolar solvent, disposing the object within a hydrophilic solution, adding the dispersion solution to the hydrophilic solution, and disposing the hybrid particles on the object.

2. The fabrication method according to claim 1, wherein the hybrid particles have a spherical shape.

3. The fabrication method according to claim 2, wherein, in disposition of the hybrid particles into the single layer, the hybrid particles are disposed on the surface of the object in a matrix.

4. The fabrication method according to claim 3, wherein, in disposition of the hybrid particles into the single layer, the hybrid particles has a hexagonal close packed structure in which one hybrid particle is surrounded by six neighboring hybrid particles.

5. The fabrication method according to claim 3, wherein, in disposition of the hybrid particles into the single layer, one hybrid particle contacts six neighboring hybrid particles.

6. The fabrication method according to claim 5, wherein the hybrid particles are etched so that the volumes of the hybrid particles are reduced and the hybrid particles do not contact one another.

7. The fabrication method according to claim 1, wherein, in addition of the dispersion solution to the hydrophilic solution, the dispersion solution floats on the hydrophilic solution.

8. The fabrication method according to claim 1, wherein, in addition of the dispersion solution to the hydrophilic solution, a monolayer of the dispersion solution floats on the hydrophilic solution.

9. The fabrication method according to claim 1, wherein, in disposition of the hybrid particles on the object, an amphiphilic solution is added to the hydrophilic solution so that the hybrid particles vertically overlap the object.

10. The fabrication method according to claim 9, wherein, in disposition of the hybrid particles on the object, the hydrophilic solution is removed.

11. The fabrication method according to claim 1, wherein the nonpolar solvent is one of ethyl alcohol, isopropyl alcohol, methanol, a nucleic acid and butanol.

12. The fabrication method according to claim 1, wherein the hybrid particles include Si.

13. The fabrication method according to claim 1, wherein the hybrid particles are formed of polydimethylsiloxane or polymethylsilsesquioxane.

14. The fabrication method according to claim 1, wherein the object includes one of a light emitting element, a touch panel and a touchscreen.

15. The fabrication method according to claim 1, wherein the plate pattern is electrically connected to the object.

16. The fabrication method according to claim 1, wherein the plate pattern includes one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, a metal grid, a silver nanowire and graphene.

17. The fabrication method according to claim 16, wherein the plate pattern is formed by stacking multiple layers formed of different kinds of materials.

18. The fabrication method according to claim 1, wherein a sacrificial layer is formed on the surface of the object on which the hybrid particles are disposed.

19. The fabrication method according to claim 1, wherein, in formation of the plate pattern, a transparent electrode is deposited on the surface of the object exposed through spaces among the hybrid particles after etching.

* * * * *